United States Patent
Peterson et al.

(10) Patent No.: US 10,418,291 B2
(45) Date of Patent: Sep. 17, 2019

(54) INDUCED WARPAGE OF A THERMAL CONDUCTOR

(71) Applicant: Intel Corporation, Santa Clara, CA (US)

(72) Inventors: Jerrod Peterson, Hillsboro, OR (US); David Pidwerbecki, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/720,499

(22) Filed: Sep. 29, 2017

(65) Prior Publication Data

US 2019/0103326 A1 Apr. 4, 2019

(51) Int. Cl.
| | |
|---|---|
| *H01L 21/66* | (2006.01) |
| *H01L 23/34* | (2006.01) |
| *H01L 21/02* | (2006.01) |
| *H01L 23/36* | (2006.01) |
| *H01L 23/42* | (2006.01) |
| *H01L 23/433* | (2006.01) |

(52) U.S. Cl.
CPC .............. *H01L 22/12* (2013.01); *H01L 21/02* (2013.01); *H01L 23/34* (2013.01); *H01L 23/36* (2013.01); *H01L 23/42* (2013.01); *H01L 23/433* (2013.01)

(58) Field of Classification Search
CPC ........ H01L 23/34; H01L 23/36; H01L 23/367
See application file for complete search history.

(56) References Cited

U.S. PATENT DOCUMENTS

| | | | | |
|---|---|---|---|---|
| 6,936,501 B1* | 8/2005 | Too | ........................ | H01L 23/04 438/122 |
| 2003/0161109 A1* | 8/2003 | Kurihara | ............... | H01L 21/565 361/704 |
| 2004/0075987 A1* | 4/2004 | Shim, II | ............. | H01L 21/4878 361/704 |
| 2005/0036291 A1* | 2/2005 | Huang | ................ | H01L 21/4882 361/704 |
| 2009/0309191 A1* | 12/2009 | Theuss | ................ | H01L 21/0201 257/618 |

\* cited by examiner

*Primary Examiner* — Peniel M Gumedzoe
(74) *Attorney, Agent, or Firm* — Patent Capital Group

(57) ABSTRACT

Particular embodiments described herein provide for a silicon layer, where the silicon layer includes a profile and a thermal conductor coupled to the silicon layer, where the thermal conductor includes one or more residual stresses. The thermal conductor is modified based on the one or more residual stress such that when pressure is applied to the thermal conductor, a profile of the thermal conductor at least approximately matches the profile of the silicon layer. In an example, the thermal conductor is modified by removing material from one or more areas of the thermal conductor and the thermal conductor is coupled to the silicon layer by one or more pressure inducing mechanisms.

10 Claims, 7 Drawing Sheets

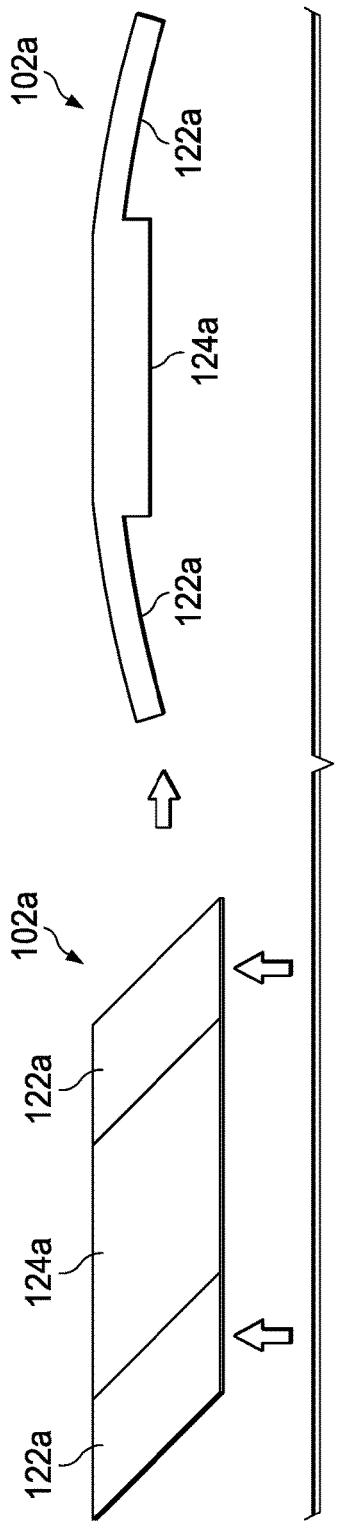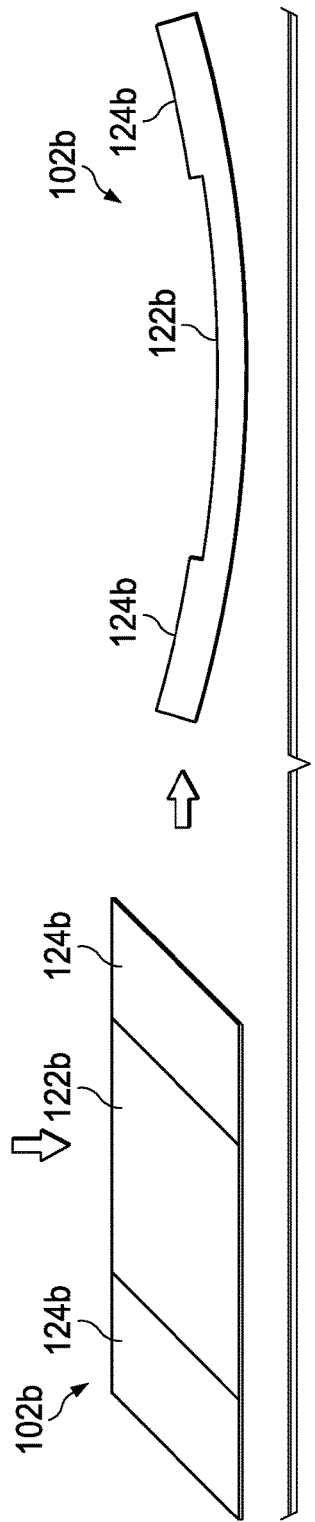

INDUCED WARPAGE OF A THERMAL CONDUCTOR

TECHNICAL FIELD

This disclosure relates in general to the fields of computing and, more particularly, to an induced warpage in a thermal conductor.

BACKGROUND

A system on a chip or system on chip (SoC) is an integrated circuit (also known as an "IC" or "chip") that integrates components of a computer or other electronic systems. The SoC may contain digital, analog, mixed-signal, and often radio-frequency functions all on a single substrate. SoCs are common in the mobile computing market because of their low power-consumption. One issue with SoCs, and most if not all electronics, is that they generate heat.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 3A is a simplified block diagram of a thermal conductor with an induced warpage, in accordance with an embodiment of the present disclosure;

FIG. 3B is a simplified block diagram of a thermal conductor with an induced warpage, in accordance with an embodiment of the present disclosure;

Figure 1:
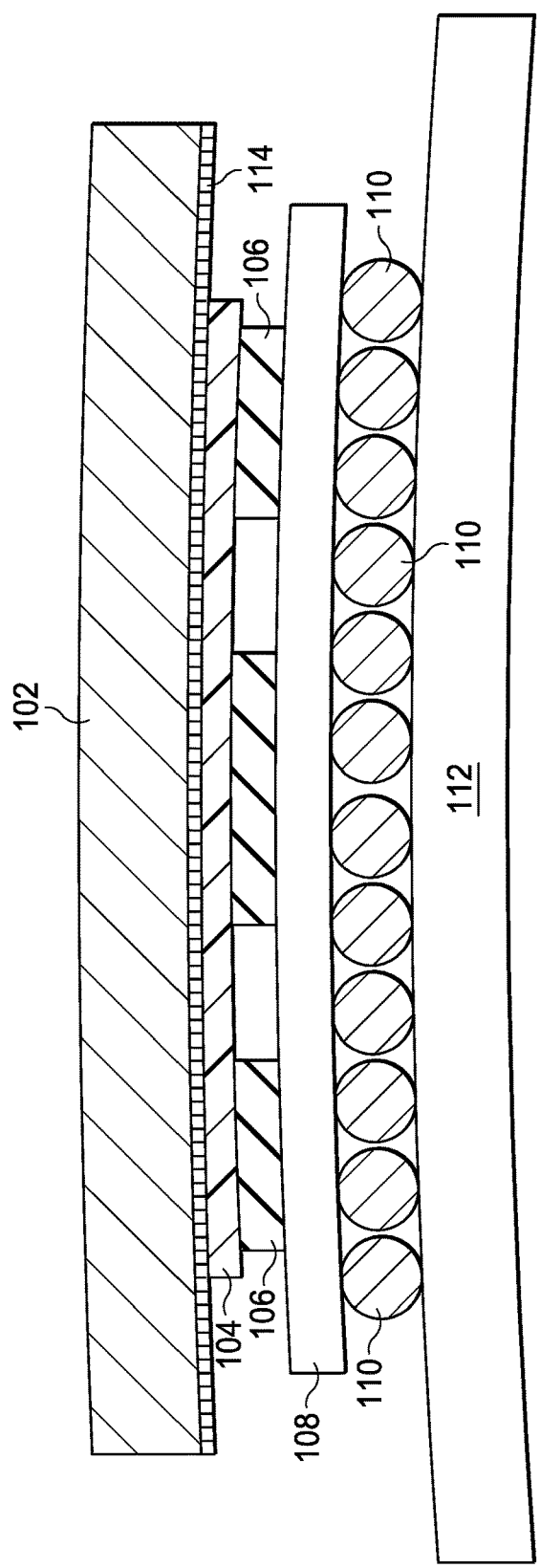
FIG. 1 is a simplified cutaway block diagram of a thermal conductor with an induced warpage, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth example embodiments of apparatuses, methods, and systems relating to a system for enabling induced warpage of a thermal conductor. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Implementations of the embodiments disclosed herein may be formed or carried out on a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

In the following detailed description, reference is made to the accompanying drawings that form a part hereof wherein like numerals designate like parts throughout, and in which is shown, by way of illustration, embodiments that may be practiced. The figures may illustrate straight or curved lines and/or parallel features however, one skilled in the art will recognize that the scope of the present disclosure does not require straight or curved lines and/or parallel features and deviation is allowed. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

FIG. 1 is a simplified block diagram of a warped thermal conductor 102 with an induced warpage. In an example, thermal conductor 102 can be over silicon 106. The silicon 106 can be over a substrate 108 with a layer of thermal interface material 104 between thermal conductor 102 and silicon 106. Substrate 108 can be over a printed circuit board 112 with a layer of solder 110 between substrate 108 and printed circuit board 112. Thermal conductor 102 can include warped profile 114 to match or proximately match the warpage or curvature of silicon 106.

Thermal conductor 102 can be a cold plate comprising copper, aluminum, and/or some other material that can conduct thermal energy away from silicon 106. Thermal interface material 104 can be grease, a gap pad, gap filler, phase change material, or some other material that has a low thermal resistance and can help couple thermal conductor 102 to silicon 106 and conduct heat from silicon 106 to thermal conductor 102. Thermal interface material 104 can be relatively fluid to cover at the microstructure level and fill in gaps and imperfections that may increase the thermal resistance between thermal conductor 102 and silicon 106. Substrate 108 can be an interposer (e.g., circuit board, etc.) between silicon 106 and printed circuit board 112 that allows for electrical connections to silicon 106. Printed circuit board 112 can be a motherboard, main printed circuit board, main computer board, etc.

In a specific illustrative example, an apparatus can include a silicon layer, where the silicon layer includes a profile. A thermal conductor can be coupled to the silicon layer, where the thermal conductor includes one or more residual stresses. The thermal conductor can be modified based on the one or more residual stress such that when pressure is applied to the thermal conductor, a profile of the thermal conductor at least approximately matches the profile of the silicon layer. The thermal conductor can be coupled to the silicon layer by one or more pressure inducing mechanisms. In an implementation, the thermal conductor can be modified by removing material from one or more areas of the thermal conductor. The profile of the silicon layer can be determined using an optical scan, by determining warpage of a package that includes the silicon layer and estimating the profile of the silicon layer, or some other means for determining or estimating the profile of the silicon layer.

For purposes of illustrating certain example techniques of thermal conductor 102, it is important to understand the following foundational information may be viewed as a basis from which the present disclosure may be properly explained.

System-on-chip (SoC) package thermal performance is dependent on the ability to make uniform, thin thermal interface material (TIM) thickness. Heat spreader cold plates allow for heat transfer without moving parts in space and weight-constrained applications. Cold plates transfer heat from sources such as electronic components, rejecting it to ambient air through forced convection, natural convection, liquid coolants (water, glycol/water mixtures, dielectric fluids, polyalphaolefin, polyalphaolefin (PAO), etc.), etc.

Multiple SoC packages are relatively large and often have complex, convex warpage making it relatively difficult to have uniform TIM thickness. Current cold plate implementations involve pressing a flat cold plate down very firmly onto the warped SoC. This approach often generates highly variable TIM thickness and undesirably high pressure on the silicon, which can lead to the growth of microscopic cracks and eventual silicon cracking failure. What is needed is a system to induce warpage or curvature in a cold plate.

A thermal conductor, as outlined in FIG. 1, can resolve these issues (and others). Thermal conductor 102 can be created by utilizing the residual stresses in rolled thermal conductor material (e.g., cold plate material) to create complex thermal conductor warpage that closely aligns with the profile of a package and can minimize TIM thickness variation and thermal conductor induced stresses on the silicon. In an example, material can be removed from thermal conductor 102 which induces a desired warpage of the thermal conductor that generally follows the warpage of the package, especially the silicon. When thermal conductor is pressed onto and/or secured to the package, the profile of thermal conductor 102 can at least proximately match the profile of the silicon and achieve a thinner and/or more uniform TIM thickness and/or a reduction in the occurrence of high pressure points on the silicon as compared to current implementations. Generally, the warpage will be a curve or curve like profile however, thermal conductor 102 can be made to warp into other complex profile shapes.

In an example, a thermal conductor can be fabricated with a warpage to match or proximately match the profile of the SoC surfaces by leveraging residual stresses that are present in the thermal conductor. Removing thin surface regions of the thermal conductor material that contain residual stresses causes a redistribution of the internal stresses in the otherwise flat thermal conductor, which in turn causes the thermal conductor to change shape.

The thermal conductor material can be removed in any number of geometries (broad areas, lines, perforated contours, etc.) using existing material removal processes to generate the desired shape and magnitude of warpage. For example, chemical etching, machining, laser ablation, EDM, or other methods of thermal conductor material removal can produce complex shapes not easily replicable by other methods. This can be used to create custom silicon-to-thermal conductor matched pairs which minimizes TIM thickness and silicon stresses. In addition, the included warpage in the thermal conductor can be cost-effectively tuned to minimize the thermal resistance at the silicon-thermal conductor interface and improve the overall SoC performance, without resorting to high mechanical loading on the silicon and without physically cutting a curved 3-D surface geometry into the thermal conductor.

Typical SoC package warpage resulting from the surface mount technology (SMT) process can range anywhere from about 20 to about 200 μm and is typically convex in shape when a package stiffener is used (though concave or other warpage is possible). When metal such as copper is rolled at cold temperatures into a thin sheet, stresses are formed in the material due to the forming process. These stresses are especially prevalent at the surface of the material and are known as 'residual' because they exist even when the material is in an unloaded condition. Removing regions of the material that contain residual stresses causes a redistribution of the internal stresses in the otherwise flat thermal conductor, which in turn causes the thermal conductor to change shape. Efficiently leveraging this process for high-volume manufacturing (HVM) requires characterizing, controlling, and/or predicting the residual stress present in large quantities of thermal conductor. This can be achieved through any number of approaches, such as in-house annealing and cold rolling of thermal conductors, strict supply chain control, empirical sampling of lots as part of lot machining process, grain size identification, analytical modeling of the manufacturing processes such as annealing and cold rolling, etc. The residual stresses can be leveraged to warp the thermal conductor to a desired profile.

Figure 2:
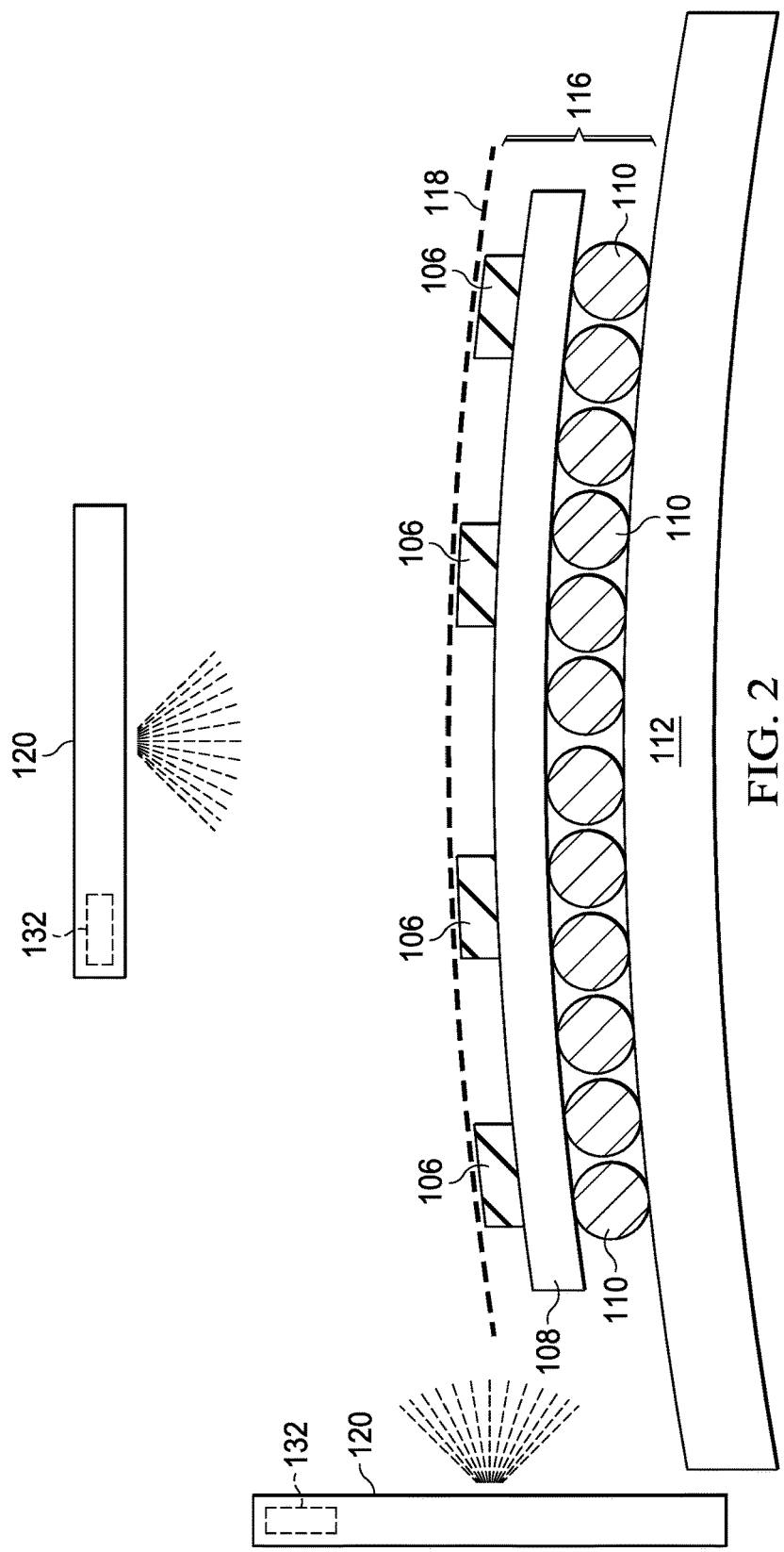
FIG. 2 is a simplified cutaway block diagram, in accordance with an embodiment of the present disclosure.

Turning to FIG. 2, FIG. 2 is a simplified block diagram of silicon 106 on substrate 108, in accordance with an embodiment of the present disclosure. Silicon 106, substrate 108, and solder 110 can comprise a package 116. As stated above, warpage of package 116 can make it very difficult to have uniform TIM thickness. In an example, warpage detection 120 can be used to determine a warpage of package 116 and more importantly a warpage 118 as it relates to silicon 106. Note that warpage 118 may be a curve, as illustrated in FIG. 2, a compound curve where the silicon 106, substrate 108, and/or printed circuit board 112 have differing magnitudes of curvature, an irregular shape, or some other type of warpage.

In an example, warpage detection 120 can be configured to determine or estimate warpage 118 of silicon 106 using warpage detection engine 132. Warpage 118 can be determined or estimated using an optical scan, a contact or touch-probe measurement, analytical modeling of the SoC package and printed circuit board 112 manufacturing processes, etc.

In another example, warpage detection 120 may not be able to determine warpage 118 of silicon 106. In this example, a warpage of package 116 may be determined or estimated and warpage 118 of silicon 106 may be estimated from the warpage of package 116. The warpage of package 116 can be a good indicator of warpage 118 as it relates to silicon 106. The warpage of package 116 can be determined or estimated using an optical scan, a contact or touch-probe measurement, analytical modeling of the SoC package and printed circuit board 112 manufacturing processes, etc.

In yet another example, warpage detection 120 may not be able to determine warpage 118 of silicon 106 or the warpage of package 116. In this example, a warpage of printed circuit board 112 may be determined or estimated and warpage 118 of silicon 106 may be estimated from the warpage of printed circuit board 112. The warpage of printed circuit board 112 can be an indicator of warpage 118 as it relates to silicon 106. The warpage of printed circuit board 112 can be determined or estimated using an optical scan, a contact or touch-probe measurement, analytical modeling of the SoC package and printed circuit board 112 manufacturing processes, etc.

There are many techniques, methods, processes, etc. than can be used to determine or estimate warpage 118 of silicon 106 and all are within the scope of this disclosure. Once warpage 118 has been determined or estimated, thermal conductor 102 can be modified to proximately follow or match warpage 118 when thermal conductor 102 is pressed onto and/or secured to package 116.

Turning to FIG. 3A, FIG. 3A is a simplified block diagram of thermal conductor 102a, in accordance with an embodiment of the present disclosure. As illustrated in FIG. 3A, material has been removed from removal area 122a and no material was removed from non-removal area 124a. In an example, warpage detection engine 132 determined, estimated, etc. a profile of warpage (e.g., warpage 118) as it relates to silicon 106 and that material needed to be removed from removal area 122a to create a matching or mating profile. The combination of removal area 122a and non-removal area 124a results in a redistribution of the residual stresses and a profile as illustrated in FIG. 3A, such that the desired warpage is induced in thermal conductor 102a and generally follows or matches the determined warpage of silicon 106. As a result, when thermal conductor 102a is pressed onto and/or secured to package 116, the profile and shape of thermal conductor 102a and package 116 are more closely matched, thus achieving a thinner and/or more uniform TIM thickness without localized regions of relatively high pressure on the silicon.

Turning to FIG. 3B, FIG. 3B is a simplified block diagram of thermal conductor 102b, in accordance with an embodiment of the present disclosure. As illustrated in FIG. 3B, material has been removed from removal area 122b and no material was removed from non-removal area 124b. In an example, warpage detection engine 132 determined, estimated, etc. a profile of warpage (e.g., warpage 118) as it relates to silicon 106 and that material needed to be removed from removal area 122b to create a matching or mating profile. The combination of removal area 122b and non-removal area 124b results in a redistribution of the residual stresses and a profile as illustrated in FIG. 3B, such that the desired warpage is induced in thermal conductor 102b and generally follows or matches the determined warpage of silicon 106. As a result, when thermal conductor 102b is pressed onto and/or secured to package 116, the profile and shape of thermal conductor 102b and package 116 are more closely matched, thus achieving a thinner and/or more uniform TIM thickness without localized regions of relatively high pressure on the silicon.

Figure 4:
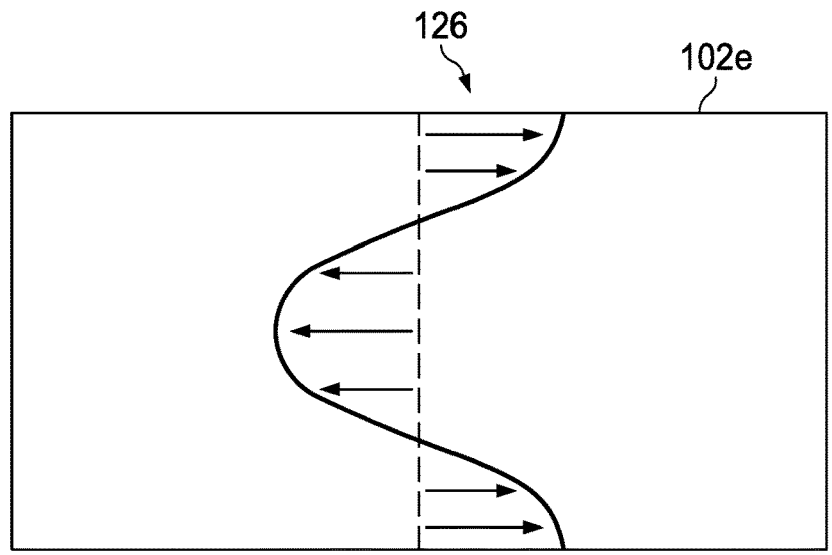
FIG. 4 is a simplified block diagram of a portion of a thermal conductor, in accordance with an embodiment of the present disclosure.

Turning to FIG. 4, FIG. 4 is an illustrative example of residual stresses 126 in thermal conductor 102c, in accordance with an embodiment. Residual stresses 126 can be leveraged to cause a redistribution of the internal stresses in an otherwise flat thermal conductor, which in turn causes the thermal conductor to change shape. The identification of residual stress 126 can be done by controlling the in-house annealing and cold rolling of plates, strict supply chain control, empirical sampling of lots as part of lot machining process, grain size identification, analytical modeling of the manufacturing processes such as annealing and cold rolling, etc. Once the residual stress 126 in thermal conductor 102c is identified, one or more regions of the thermal conductor material that contain residual stresses can be removed to cause a redistribution of the internal stresses in the otherwise flat thermal conductor, which in turn causes the thermal conductor to produce complex shapes not easily replicable by other methods.

Figure 5A:
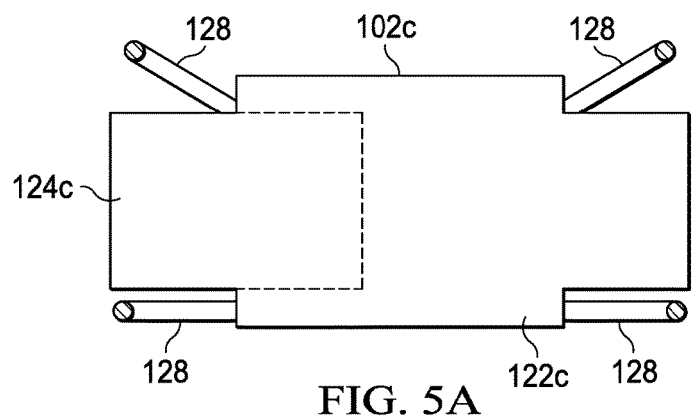
FIG. 5A is a simplified block diagram of a thermal conductor, in accordance with an embodiment of the present disclosure.

Turning to FIG. 5A, FIG. 5A is a simplified block diagram of a thermal conductor 102c, in accordance with an embodiment of the present disclosure. As illustrated in FIG. 5A, thermal conductor 102c can include one or more pressure inducing mechanisms 128 that help to press onto and/or secure thermal conductor 102c to silicon (e.g., silicon 106) and/or a package (e.g., package 116). Pressure inducing mechanisms 128 can be springs or some other mechanism that can help press, hold, secure, etc. thermal conductor 102c to silicon 106 and/or package 116. As illustrated in FIG. 5A, removal area 122c and non-removal area 124c are not straight areas (e.g., not like the relative straight removal area 122a and non-removal area 124a illustrated in FIG. 3A) and help allow thermal conductor 102c achieve a desired profile.

Figure 5B:
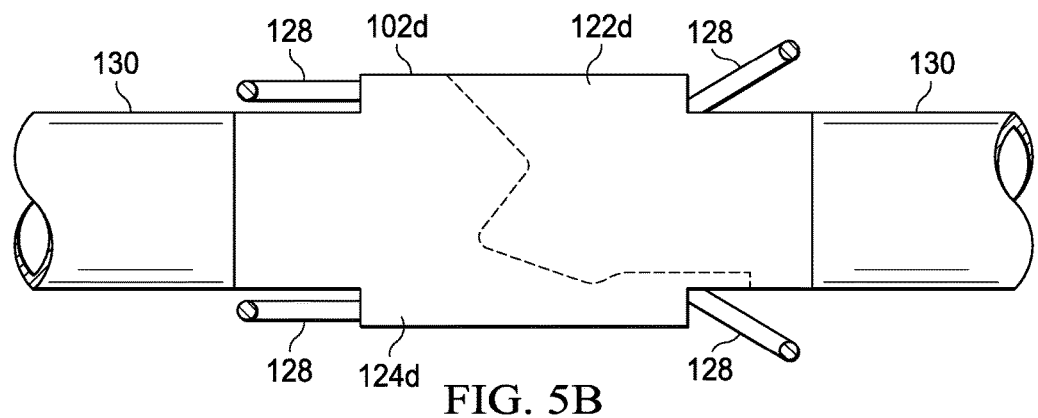
FIG. 5B is a simplified block diagram of a thermal conductor, in accordance with an embodiment of the present disclosure.

Turning to FIG. 5B, FIG. 5B is a simplified block diagram of a thermal conductor 102d, in accordance with an embodiment of the present disclosure. As illustrated in FIG. 5B, thermal conductor 102d can include one or more pressure inducing mechanisms 128 and a heat removal mechanism 130. Heat removal mechanism 130 may be heat pipe, fan, liquid conduit, or some mechanism to help remove heat from thermal conductor 102d. As illustrated in FIG. 5B, removal area 122d and non-removal area 124d are not straight lines or areas (e.g., not like the relative straight removal area 122a and non-removal area 124a illustrated in FIG. 3A) and help allow thermal conductor 102d achieve a desired profile.

Figure 6:
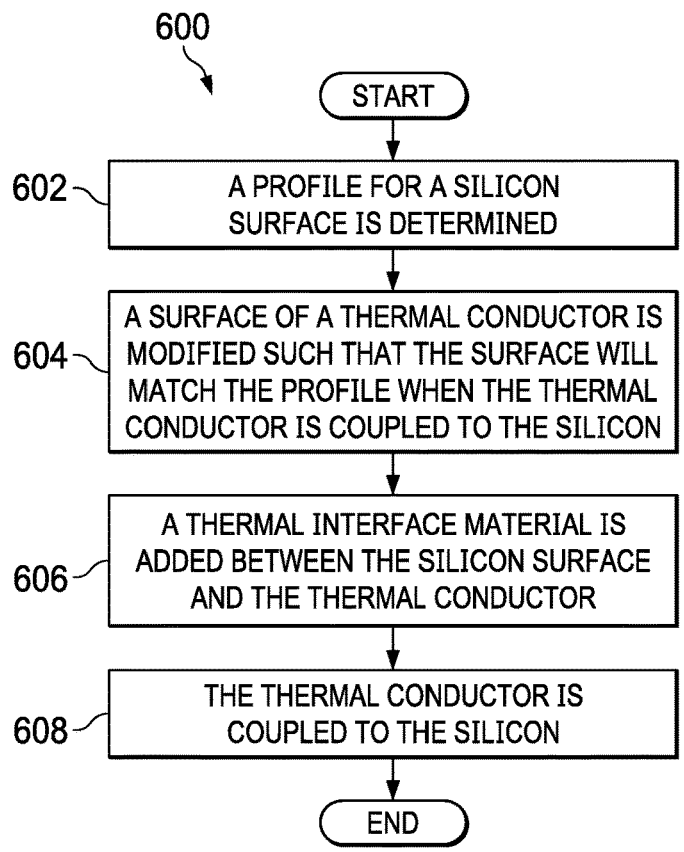
FIG. 6 is a simplified flowchart illustrating potential operations that may be associated with the induced warpage of a thermal conductor in accordance with an embodiment.

Turning to FIG. 6, FIG. 6 is an example flowchart illustrating possible operations of a flow 600 that may be associated with an induced warpage of a thermal conductor (e.g., thermal conductor 102), in accordance with an embodiment. In an embodiment, one or more operations of flow 600 may be performed by warpage detection engine 132 and/or warpage detection 120. At 602, a profile for a silicon surface is determine. In an example, the profile for the silicon can be determined or estimated using an optical scan, a contact or touch-probe measurement, analytical modeling of the SoC package and printed circuit board manufacturing processes, etc. At 604, a surface of a thermal conductor (e.g., thermal conductor 102) is modified such that the surface will match (or closely match) the profile of the silicon when the thermal conductor is coupled to the silicon. In an example, the thermal conductor can be modified by thermally-inducing stresses in the thermal conductor, which may consist of two or more layers, joined together, of materials with differing coefficients of thermal expansion. In another example, the thermal conductor can be modified by removing material from one or more areas of the thermal conductor based on the identified or predicted residual stresses in the thermal conductor. In yet another example, the thermal conductor can be modified by identifying or predicting thermally-induced stresses in the thermal conductor and removing material from one or more areas of the thermal conductor that include the thermally-induced stresses. At 606, a thermal interface material is added between the silicon surface and the thermal conductor. At 608, the thermal conductor is coupled to the silicon. In other examples, a profile for a non-silicon surface is determined. The non-silicon surface can be almost any heat generating warped surface (e.g., a gas heater, resistive heater, portion of an engine or some other heat producing device, etc.).

Figure 7:
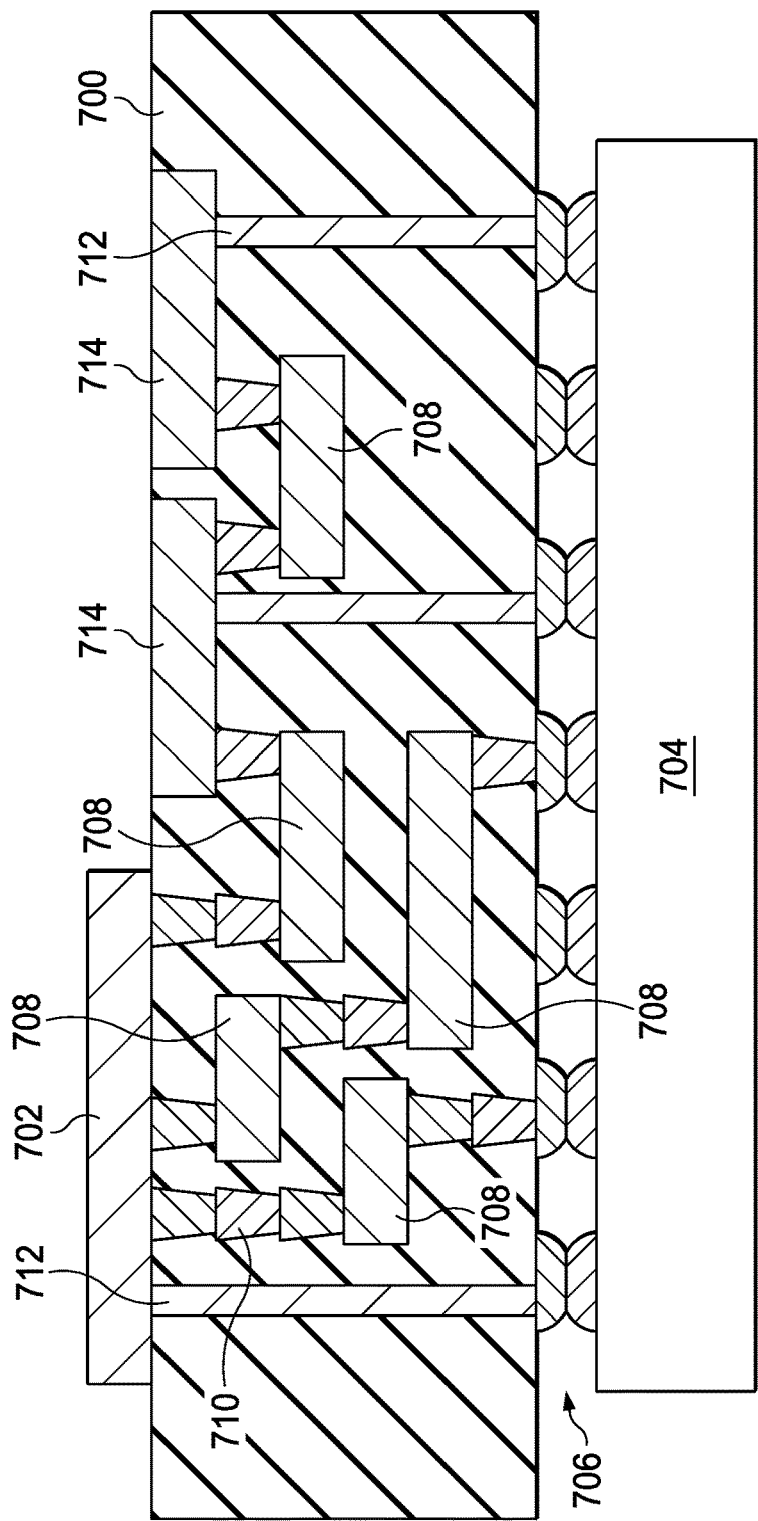
FIG. 7 is an interposer implementing one or more of the embodiments disclosed herein.

Turning to FIG. 7, FIG. 7 illustrates an interposer 700 that can include or interact with one or more embodiments disclosed herein. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with various embodiments, apparatuses or processes disclosed herein may be used in the fabrication of interposer 700.

Figure 8:
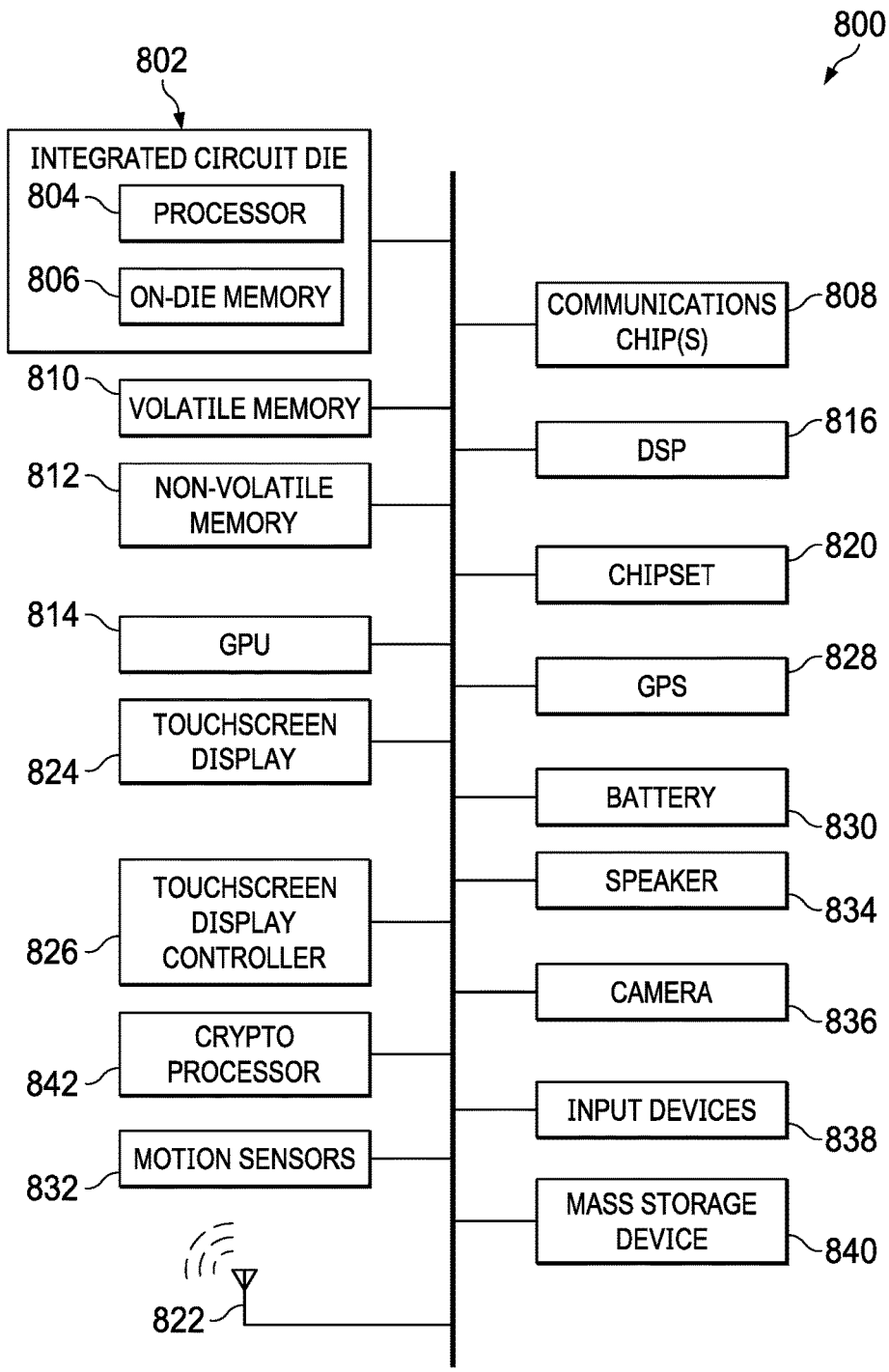
FIG. 8 is a computing device built in accordance with an embodiment disclosed herein.

Turning to FIG. 8, FIG. 8 illustrates a computing device 800 in accordance with various embodiments. The computing device 800 may include a number of components. In one embodiment, these components are attached to one or more motherboards. In an alternate embodiment, some or all of these components are fabricated onto a single system-on-a-chip (SoC) die. The components in the computing device 800 include, but are not limited to, an integrated circuit die 802 and at least one communications logic unit 808. In some implementations, the communications logic unit 808 is fabricated within the integrated circuit die 802 while in other implementations the communications logic unit 808 is fabricated in a separate integrated circuit chip that may be bonded to a substrate or motherboard that is shared with or electronically coupled to the integrated circuit die 802. The integrated circuit die 802 may include a CPU 804 as well as on-die memory 806, often used as cache memory, that can be provided by technologies such as embedded DRAM (eDRAM) or spin-transfer torque memory (SUM or STT-MRAM).

Computing device 800 may include other components that may or may not be physically and electrically coupled to the motherboard or fabricated within an SoC die. These other components include, but are not limited to, volatile memory 810 (e.g., DRAM), non-volatile memory 812 (e.g., ROM or flash memory), a graphics processing unit 814 (GPU), a digital signal processor 816, a crypto processor 842 (a specialized processor that executes cryptographic algorithms within hardware), a chipset 820, an antenna 822, a display or a touchscreen display 824, a touchscreen controller 826, a battery 830 or other power source, a power amplifier (not shown), a voltage regulator (not shown), a global positioning system (GPS) device 828, a motion coprocessor or sensors 832 (that may include an accelerometer, a gyroscope, and a compass), a speaker 834, a camera 836, user input devices 838 (such as a keyboard, mouse, stylus, and touchpad), and a mass storage device 840 (such as hard disk drive, compact disk (CD), digital versatile disk (DVD), and so forth).

The communications logic unit 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 808 may implement any of a number of wireless standards or protocols, including but not limited to Wi-Fi (IEEE 802.11 family), WiMAX (IEEE 802.16 family), IEEE 802.20, long term evolution (LTE), evolution-data optimized (Ev-DO), high speed packet access (HSPA), HSPA+, high speed downlink packet (HSDPA), HSDPA+, high speed uplink packet (HSUPA), HSUPA+, enhanced data for global evolution (EDGE), global system for mobile communications (GSM), general packet radio service (GPRS), code division multiple access (CDMA), time division multiple access (TDMA), DECT, Bluetooth, derivatives thereof, as well as any other wireless protocols that are designated as 3G, 4G, 5G, and beyond. The computing device 800 may include a plurality of communications logic units 808. For instance, a first communications logic unit 808 may be dedicated to shorter range wireless communications such as Wi-Fi and Bluetooth and a second communications logic unit 808 may be dedicated to longer range wireless communications such as GPS, EDGE, GPRS, CDMA, WiMAX, LTE, Ev-DO, and others.

The processor 804 of the computing device 800 can communicate with one or more devices that are formed in accordance with various embodiments. The term "processor" may refer to any device or portion of a device that processes electronic data from registers and/or memory to transform that electronic data into other electronic data that may be stored in registers and/or memory.

The communications logic unit 808 may also include one or more devices, such as transistors or metal interconnects, that are in communication with various ones of the embodiments disclosed herein. In further embodiments, another component housed within the computing device 800 may contain one or more devices, such as transistors or metal interconnects, that are formed in accordance with implementations of the embodiments disclosed herein.

In various embodiments, the computing device 800 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

The above description of illustrated implementations, including what is described in the Abstract, is not intended to be exhaustive or to limit the scope of the disclosure to the precise forms disclosed. While specific implementations of, and examples for, the embodiments disclosed herein are described herein for illustrative purposes, various equivalent modifications are possible within the scope of the disclosure, as those skilled in the relevant art will recognize.

Note that with the examples provided herein, interaction may be described in terms of two, three, or more network elements. However, this has been completion for purposes of clarity and example only. In certain cases, it may be easier to describe one or more of the functionalities of a given set of flows by only referencing a limited number of network elements. It should be appreciated that thermal conductor 102, package 116, etc. and their teachings are readily scalable and can accommodate a large number of components, as well as more complicated/sophisticated arrangements and configurations. Accordingly, the examples provided should not limit the scope or inhibit the broad teachings of the induced warpage of thermal conductor 102 as potentially applied to a myriad of other architectures.

It is also important to note that the operations in the preceding flow diagram (i.e., FIG. 6) illustrates only some of the possible correlating scenarios and patterns that may be executed. Some of these operations may be deleted or removed where appropriate, or these operations may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. Substantial flexibility is provided by the induced warpage of thermal conductor 102 in that any suitable arrangements, chronologies, configurations, and mechanisms may be provided without departing from the teachings of the present disclosure.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although the induced warpage of thermal conductor 102 has been illustrated with reference to particular elements and operations that facilitate the the induced warpage of thermal conductor 102, these elements and operations may be replaced by any suitable architecture, protocols, and/or processes that achieve the intended functionality of thermal conductor 102.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes And Examples

Example A1 is an apparatus can include a silicon layer, where the silicon layer includes a profile, and a thermal conductor coupled to the silicon layer, where the thermal conductor includes one or more residual stresses. In an example, the thermal conductor can be modified based on the one or more residual stress such that when pressure is applied to the thermal conductor, a profile of the thermal conductor at least approximately matches the profile of the silicon layer.

In Example A2, the subject matter of Example A1 can optionally include where the thermal conductor is coupled to the silicon layer by one or more pressure inducing mechanisms.

In Example A3, the subject matter of any one of Examples A1-A2 can optionally include where the silicon layer is over a substrate.

In Example A4, the subject matter of any one of Examples A1-A3 can optionally include where the thermal conductor was modified by removing material from one or more areas of the thermal conductor.

In Example A5, the subject matter of any one of Examples A1-A4 can optionally include where the thermal conductor is a cold plate.

In Example A6, the subject matter of any one of Examples A1-A5 can optionally include where the profile of the silicon layer was determined using an optical scan.

In Example A7, the subject matter of any one of Examples A1-A6 can optionally include where the profile of the silicon layer was determined by determining warpage of a package that includes the silicon layer and estimating the profile of the silicon layer.

In Example A8, the subject matter of any one of Examples A1-A7 can optionally include where a thermal interface material is used to help couple the thermal conductor to the silicon layer.

In Example M1, a method can include determining a profile for a silicon layer, identifying one or more residual stresses in a thermal conductor, modifying the thermal conductor based on the identified one or more residual stresses such that when pressure is applied to the thermal conductor, where a profile of the thermal conductor at least approximately matches the profile of the silicon layer, and coupling the thermal conductor to the silicon layer.

In Example, M2, the subject matter of Example M1 can optionally include coupling the thermal conductor to the silicon layer using one or more pressure inducing mechanisms.

In Example M3, the subject matter of any one of Examples M1-M2 can optionally include where modifying the thermal conductor includes removing material from one or more areas of the thermal conductor.

In Example M4, the subject matter of any one of Examples M1-M3 can optionally include where the profile of the silicon layer is determined by using an optical scan.

In Example M5, the subject matter of any one of Examples M1-M4 can optionally include where the profile of the silicon layer is determined by determining warpage of a package that includes the silicon layer and estimating the profile of the silicon layer.

In Example M6, the subject matter of any one of Examples M1-M5 can optionally include where the silicon layer is over a substrate.

Example AA1 is an integrated circuit assembly including a substrate, a silicon layer above the substrate, where the silicon layer includes a profile, and a thermal conductor coupled to the silicon layer, where the thermal conductor includes one or more residual stresses. In an example, the thermal conductor can be modified based on the one or more residual stress such that when pressure is applied to the thermal conductor, a profile of the thermal conductor at least approximately matches the profile of the silicon layer.

In Example AA2, the subject matter of Example AA1 can optionally include where the thermal conductor is coupled to the silicon layer by one or more pressure inducing mechanisms.

In Example AA3, the subject matter of any one of the Examples AA1-AA2 can optionally include where the thermal conductor was modified by removing material from one or more areas of the thermal conductor.

In Example AA4, the subject matter of any one of the Examples AA1-AA3 can optionally include where the thermal conductor is a cold plate.

In Example AA5, the subject matter of any one of the Examples AA1-AA4 can optionally include where the profile of the silicon layer was determined using an optical scan.

In Example AA6, the subject matter of any one of Examples AA1-AA5 can optionally include where the profile of the silicon layer was determined by determining warpage of a package that includes the silicon layer and estimating the profile of the silicon layer.

Example S1 is a computing device including a processor mounted on a substrate, a communications logic unit within the processor, a memory in communication with the processor, a display on the computing device, a battery within the computing device, a silicon layer above the substrate, wherein the silicon layer includes a profile, and a thermal conductor coupled to the silicon layer, where the thermal conductor includes one or more residual stresses, where the thermal conductor is modified based on the one or more residual stress such that when pressure is applied to the thermal conductor, a profile of the thermal conductor at least approximately matches the profile of the silicon layer.

In Example S2, the subject matter of Example S1 can optionally include where the thermal conductor is modified by removing material from one or more areas of the thermal conductor.

In Example S3, the subject matter of any one of the Examples S1-S2 can optionally include where the thermal conductor is a cold plate.

In Example S4, the subject matter of any one of the Examples S1-S3 can optionally include where the profile of the silicon layer is determined using an optical scan.

In Example S5, the subject matter of any one of the Examples S1-S4 can optionally include where the profile of the silicon layer is determined by determining warpage of a package that includes the silicon layer and estimating the profile of the silicon layer.

Example X1 is a machine-readable storage medium including machine-readable instructions to implement a method or realize an apparatus as in any one of the Examples A1-A8 or M1-M6. Example Y1 is an apparatus comprising means for performing of any of the Example methods M1-M6. In Example Y2, the subject matter of Example Y1 can optionally include the means for performing the method comprising a processor and a memory. In Example Y3, the subject matter of Example Y2 can optionally include the memory comprising machine-readable instructions.

What is claimed is:

1. A method comprising:
   determining a profile for a warped silicon layer;
   identifying one or more residual stresses in a thermal conductor, wherein a profile of the thermal conductor does not match the profile of the warped silicon layer;
   modifying the thermal conductor based on the identified one or more residual stresses such that when pressure is applied to the thermal conductor, a modified profile of the thermal conductor at least approximately matches the profile of the warped silicon layer; and
   coupling the thermal conductor to the warped silicon layer.

2. The method of claim 1, further comprising:
   coupling the thermal conductor to the warped silicon layer using one or more pressure inducing mechanisms.

3. The method of claim 1, wherein modifying the thermal conductor includes removing material from one or more areas of the thermal conductor.

4. The method of claim 1, wherein the profile of the warped silicon layer is determined by using an optical scan.

5. The method of claim 1, wherein the profile of the warped silicon layer is determined by determining warpage of a package that includes the warped silicon layer and estimating the profile of the warped silicon layer.

6. The method of claim 1, wherein the warped silicon layer is over a substrate.

7. The method of claim 3, wherein removing material from one or more areas of the thermal conductor causes a redistribution of internal stresses of the thermal conductor.

8. The method of claim 1, wherein modifying the thermal conductor includes removing material from one or more areas of the thermal conductor, wherein the one or more areas where the material is removed is based, at least partially, on the identified one or more residual stresses.

9. The method of claim 1, wherein modifying the thermal conductor includes removing material from one or more areas of the thermal conductor, wherein the one or more areas where the material is removed are located proximate to at least a portion of the identified one or more residual stresses.

10. The method of claim 1, wherein modifying the thermal conductor includes removing material from one or more areas of the thermal conductor, wherein at least a portion of the one or more areas where the material is removed includes at least a portion of the identified one or more residual stresses.

* * * * *